United States Patent
Kimura

[11] Patent Number: 5,848,210
[45] Date of Patent: Dec. 8, 1998

[54] TEMPERATURE CONTROLLED OPTICAL COUPLING STRUCTURE

[75] Inventor: Naoki Kimura, Tokyo, Japan

[73] Assignee: NEC Corporation, Tokyo, Japan

[21] Appl. No.: 877,185

[22] Filed: Jun. 17, 1997

[30] Foreign Application Priority Data

Jun. 28, 1996 [JP] Japan .................................. 8-169734

[51] Int. Cl.⁶ .................................................. G02B 6/36
[52] U.S. Cl. ............................................. 385/89; 385/88
[58] Field of Search ................................ 385/88, 89, 90, 385/91, 92, 93, 94

[56] References Cited

U.S. PATENT DOCUMENTS

| | | | |
|---|---|---|---|
| 5,355,386 | 10/1994 | Rothman et al. | 572/50 |
| 5,717,803 | 2/1998 | Yoneda et al. | 385/89 |

FOREIGN PATENT DOCUMENTS

| | | | |
|---|---|---|---|
| 03025988 | 2/1991 | Japan | 385/88 |
| 3-58006 | 3/1991 | Japan . | |
| 04084480 | 3/1992 | Japan | 385/88 |
| 04273176 | 9/1992 | Japan . | |
| 4-355706 | 12/1992 | Japan . | |
| 07254746 | 10/1995 | Japan . | |
| 08037247 | 2/1996 | Japan . | |

OTHER PUBLICATIONS

European Search Report dated Oct. 15, 1997.

*Primary Examiner*—Phan T.H. Palmer
*Attorney, Agent, or Firm*—Whitham, Curtis & Whitham

[57] ABSTRACT

A temperature controlled optical coupling device of the present invention includes an optical coupling substrate (2) carrying metal electrodes (1) on its rear. An electrode substrate (6) carries metal electrodes (3) on its front. A plurality of thermoelectric elements (4) are also carried on the front of the electrode substrate (6) and connected to leads (5). A light emitting element or similar optical element (8) and an optical fiber (7) are mounted on the substrate (2) with their optical axes aligned with each other. Also mounted on the substrate (2) is a thermistor (9) for temperature measurement. The thermoelectric elements (4) are directly connected to the metal electrodes (1) and are connected in series by the metal electrodes (1) and metal electrodes (3). When a voltage is applied between leads (5), a current flows through the thermoelectric elements (4). As a result, the substrate (2) is selectively heated or cooled due to the Peltier effect, controlling the temperature of the thermoelectric elements (4). The structure is small size and low cost and needs a minimum of power for temperature control.

5 Claims, 4 Drawing Sheets

TEMPERATURE CONTROLLED OPTICAL COUPLING STRUCTURE

BACKGROUND OF THE INVENTION

1. Field of the Invention

The present invention relates to an optical coupling structure for an optical device for use in an optical communication system and, more particularly, to an optical coupling structure with a temperature control function capable of rapidly following the variation of, e.g., ambient temperature.

2. Description of the Related Art

An optical coupling structure, e.g., a semiconductor laser or similar heat generating body and optical fiber coupling system must have its temperature controlled in order to stabilize the output light and oscillation wavelength of the laser.

An optical coupling structure with a temperature control function and applicable to, e.g., an optical module is disclosed in Japanese Patent Laid-Open Publication No. 3-58006 by way of example. In a conventional temperature controlled semiconductor laser module, light issuing from a semiconductor laser is condensed by a condensing lens and then incident to one end of an optical fiber. Light output from the other end of the laser is incident to a photodetector. Such an optical coupling system is entirely enclosed by a package. A Peltier cooler is mounted on the outer periphery of the package in order to control the temperature of the entire package. Further, a package greater in size than the above package is so arranged as to accommodate the package and Peltier cooler.

In the above optical semiconductor laser module, the outermost package isolates the interior of the module from the outside air. In addition, an air layer formed between the two packages maintains temperature inside the inner package constant.

To control the temperature of the optical coupling system, use may be made of an optical coupling substrate, as proposed in the past. The optical coupling substrate carries a light emitting element and an optical fiber optically coupled together thereon. In this case, two electrode substrates each having metal electrodes for wiring formed thereon sandwich a plurality of thermoelectric elements therebetween, constituting a Peltier cooler. The optical coupling substrate and a thermistor for temperature measurement are mounted on the Peltier cooler. The Peltier cooler controls the temperature of the light emitting element.

In the above optical coupling unit, the optical coupling substrate to be selectively heated or cooled is small in size and therefore in thermal capacity, so the Peltier cooler consumes a minimum of power. In addition, such a unit reduces the cost because the number of parts constituting it is small.

The module taught in the above Laid-Open Publication No. 3-58006 has its temperature stabilized in order to guide the light issuing from the laser to the optical fiber efficiently while insuring stable wavelength. However, a problem with this kind of module is that the inner package accommodating the entire optical coupling system must be bodily controlled in temperature, increasing the power consumption of the Peltier cooler. Another problem is that the use of two packages and condenser and other expensive optical parts increases the cost of the module.

The optical coupling unit including the optical coupling substrate is advantageous in that the substrate to be selectively heated or cooled is small in size and therefore in thermal capacity, so the Peltier cooler consumes a minimum of power, as stated previously. However, the size of the optical coupling substrate and that of an upper electrode substrate are not noticeably different. Therefore, the thermal capacity of the upper electrode substrate heretofore neglected when the object to be heated and cooled has a large size increases its influence, and in addition obstructs power saving. Moreover, although the coupling system using the optical coupling substrate is small size and advantageous for the miniaturization of the module, the Peltier cooler cannot be reduced in size, particularly in height, beyond a certain limit, obstructing the miniaturization of the entire module.

SUMMARY OF THE INVENTION

It is therefore an object of the present invention to provide a temperature controlled optical coupling structure which is small size and low cost and capable of saving power necessary for temperature control.

A temperature controlled optical coupling structure of the present invention has at least one optical semiconductor device, a first substrate on which the optical semiconductor device and an optical fiber optically connected to the optical semiconductor device are mounted, a plurality of temperature control elements, and a second substrate on which the temperature control elements are mounted. The first substrate carries substrate electrodes for wiring on its rear. The temperature control elements have their temperature control electrodes connected to the substrate electrodes.

In a preferred embodiment, a plurality of optical semiconductor devices are provided, and each is connected to one of a plurality of optical fibers. The optical semiconductor device is implemented as an optical modulating device or an optical amplifying device.

The second substrate is implemented as a package carrying electrodes for wiring and wirings for connecting the electrodes and external terminals thereon. The temperature control elements comprise Peltier elements. Further, the structure includes a thermistor connected to the first substrate for sensing the temperature of the first substrate, and a control circuit for controlling a current to flow through the Peltier elements on the basis of the temperature sensed by the thermistor.

BRIEF DESCRIPTION OF THE DRAWINGS

The above and other objects, features and advantages of the present invention will become more apparent from the following detailed description when taken in conjunction with the accompanying drawings wherein.

In the drawings, identical reference numerals denote identical structural elements.

DETAILED DESCRIPTION OF THE PREFERRED EMBODIMENTS

Figure 1:
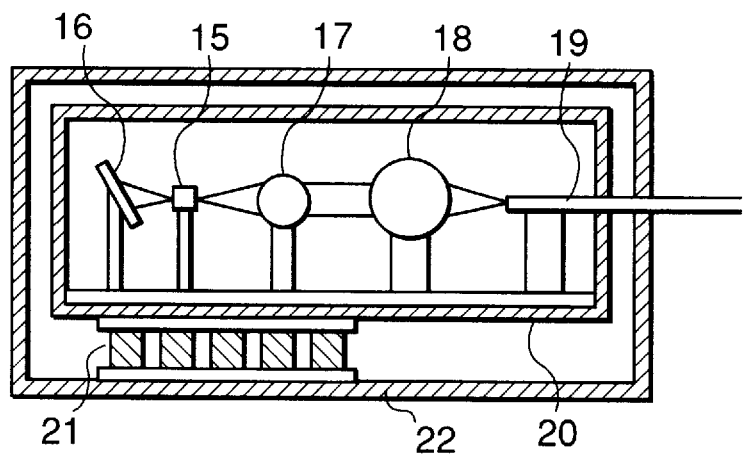
FIG. 1 is a vertical section showing a conventional optical coupling module.

To better understand the present invention, brief reference will be made to an optical coupling module with a conventional temperature controlled optical coupling structure of the type taught in, e.g., Japanese Patent Laid-Open Publication No. 3-58006 mentioned earlier. As shown in FIG. 1, the optical coupling module includes a semiconductor laser 15. Light issuing from the laser 15 is sequentially condensed by spherical lenses 17 and 18 and then input to an optical fiber 19. At the same time, light issuing from the end of the laser 15 remote from the optical fiber 19 is incident to a photodetector 16.

A first package 20 encloses the entire optical coupling system including the various optical elements stated above. A Peltier cooler 21 is mounted on the outer periphery of the first package 20 in order to control the temperature of the entire package 20. Further, a second package 22 encloses the package 20 and Peltier cooler 21. In this configuration, the package 22 isolates the inside of the module from the outside air. This, coupled with the air layer formed between the two packages 20 and 22, maintains the temperature inside the package 20 constant.

Figure 2:
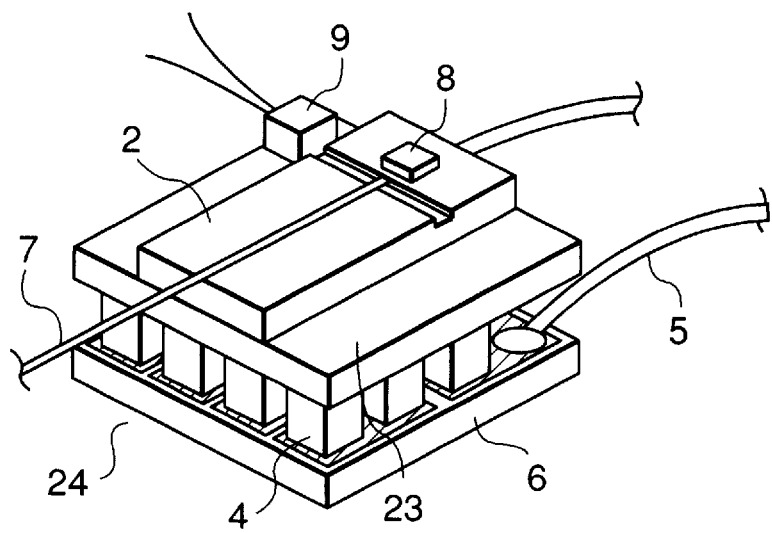
FIG. 2 is a perspective view showing another conventional optical coupling module.

FIG. 2 shows an optical coupling module implemented with another conventional temperature controlled optical coupling structure. As shown, the module includes an optical coupling substrate 2 coupling a light emitting device 8 and an optical fiber 7 thereon. A Peltier cooler 24 is made up of two electrode substrates 6 and 23 each carrying a metal electrode pattern for wiring thereon, and a plurality of thermoelectric elements 4 sandwiches between the electrode substrates 6 and 23. The optical coupling substrate 2 and a thermistor 9 for sensing temperature are mounted on the Peltier cooler 24. In this configuration, the temperature of the light emitting element 8 is adjusted.

The module shown in FIG. 1 is configured to stabilize temperature, so the light issuing from the laser 15 can reach the fiber 19 efficiently with a stable wavelength. However, a problem with this configuration is that the entire package 20 accommodating the optical coupling system must have its temperature controlled, causing the Peltier cooler 21 to consume much power. Another problem is that the two packages 20 and 22 and the expensive spherical lenses 17 and 18 increase the cost of the module.

On the other hand, the module shown in FIG. 2 is advantageous in that the Peltier cooler 24 consumes a minimum of power during temperature control because the substrate 2, which is selectively heated or cooled, is small in size and thermal capacity. In addition, this kind of module needs only a small number of parts and can therefore be produced at low cost. However, the size of the optical coupling substrate 2 and that of the upper electrode substrate 23 are not noticeably different. Therefore, the thermal capacity of the upper electrode substrate 23 heretofore neglected when the object to be heated and cooled has a large size increases its influence, and in addition obstructs power saving. Moreover, although the coupling system using the optical coupling substrate 2 is small size and advantageous for the miniaturization of the module, the Peltier cooler 24 cannot be reduced in size, particularly in height, beyond a certain limit, obstructing the miniaturization of the entire module.

Figure 3:
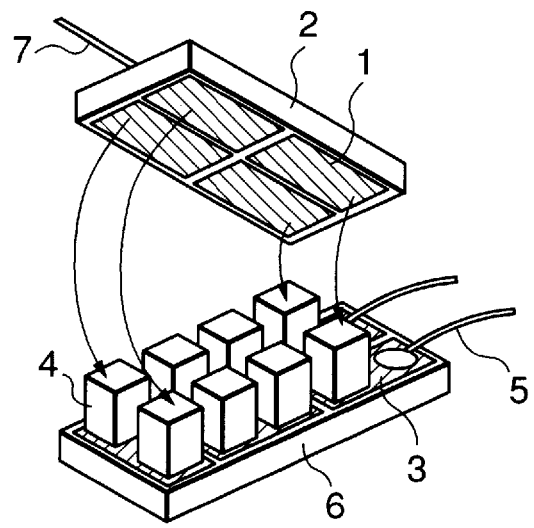
FIG. 3 is a perspective view showing a temperature controlled optical coupling structure embodying the present invention.
Figure 4:
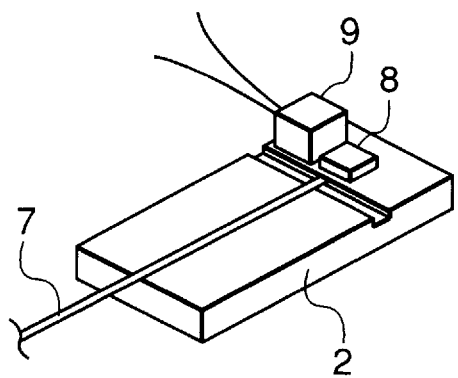
FIG. 4 is a perspective view of an optical coupling system included in the embodiment shown in FIG. 3.

Referring to FIGS. 3 and 4, a temperature controlled optical coupling structure embodying the present invention will be described. As shown in FIG. 4, a light emitting element 8 and an optical fiber 7 are mounted on an optical coupling substrate 2 with their optical axes aligned with each other. A thermistor 9 for temperature measurement is also mounted on the substrate 2. As shown in FIG. 3, metal electrodes 3 for wiring are formed on the front of an electrode substrate 6. A plurality of thermoelectric elements 4 are soldered to the electrode substrate 6 at their bottoms. Also soldered to the electrode substrate 6 are leads 5.

Metal electrodes 1 are formed on the rear or underside of the optical coupling substrate 2. The substrate 2 is soldered to the substrate 6 with its metal electrodes 1 aligned with the tops of the thermoelectric elements 4 of the substrate 6. The thermoelectric elements 4 are connected in series by the electrodes 1 and 3.

In operation, a voltage is applied between the ends of the leads 5 in order to cause a current to flow through the thermoelectric elements 4 via the electrodes 1 and 3. As a result, the substrate 2 mounted on the tops of the thermoelectric elements 4 is selectively heated or cooled due to the Peltier effect. Whether the substrate 2 is heated or cooled is determined by the direction of the current to flow through the thermoelectric elements 4. Because the degree of heating or that of cooling depends on the value of the current to flow through the thermoelectric elements 4, it is possible to control the temperature of the light emitting element 8 by measuring the temperature on the substrate 2 via the thermistor 9 and controlling the current to flow through the elements 4 on the basis of the measured temperature.

Figure 5:
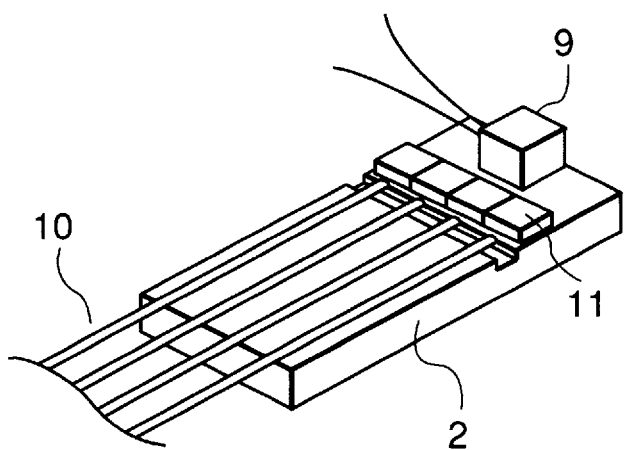
FIGS. 5 and 6 each shows an alternative embodiment of the present invention.

FIG. 5 shows an alternative embodiment of the present invention. As shown, the optical coupling system is implemented as a multichannel light emitting element array 11. The light emitting element array 11 are coupled with a multicore fiber array 10 on the optical coupling substrate 2 shown in FIG. 3. The light emitting device array 11 and optical fiber array 10 have their corresponding channels, or optical axes, aligned with each other. The thermistor 9 is mounted on the substrate 2.

Figure 6:
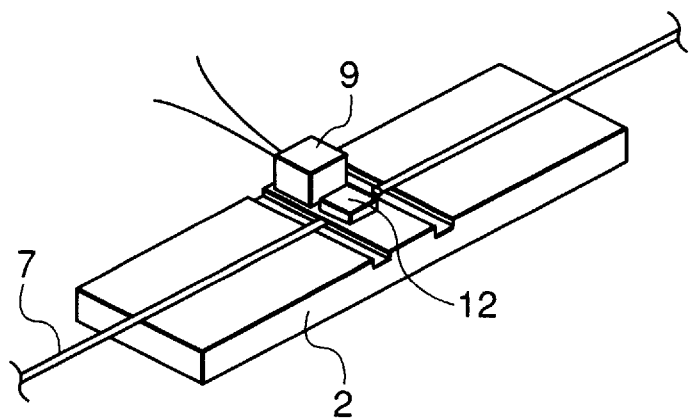

FIG. 6 shows another alternative embodiment of the present invention. As shown, an optical modulating device or optical amplifying device 12 is connected to optical fibers 7 as the optical coupling system mounted on the optical coupling substrate 2. The modulating or amplifying device 12 is positioned such that its optical axis aligns with the optical axes of the fibers 7 at both ends thereof. The thermistor 9 for temperature measurement is mounted on the substrate 2.

Figure 7:
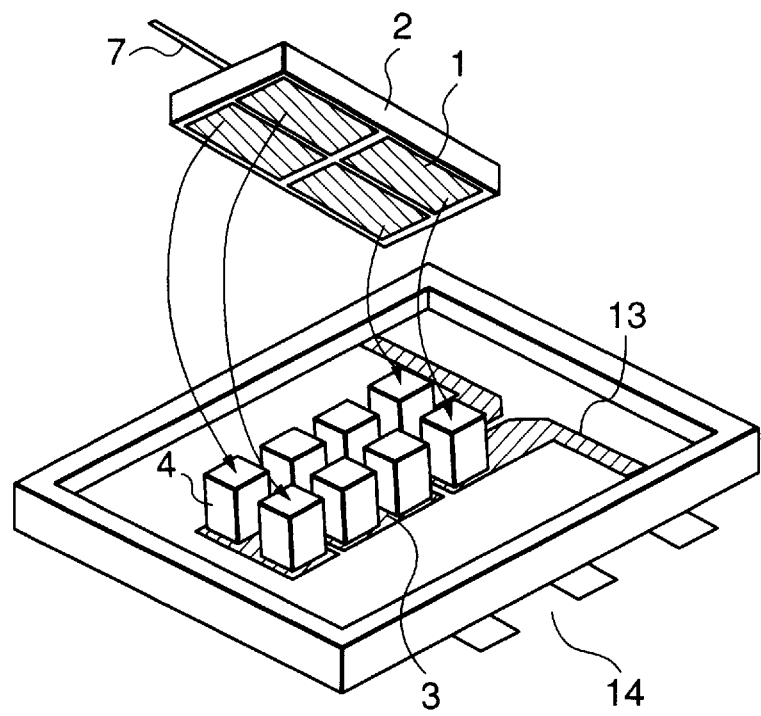
FIG. 7 is a perspective view showing a specific configuration of a temperature control section included in the structure of the present invention.

FIG. 7 shows a specific configuration of the temperature adjusting section in accordance with the present invention. As shown, the metal electrodes 3 are formed on a package 14 used to constitute an optical coupling module. Also formed on the package 14 are wirings 13 connecting the electrodes 3 and terminals provided on the package 14. The thermoelectric elements 4 are soldered to the electrodes 3 at their bottoms.

The metal electrodes 1 are formed on the rear or underside of the optical coupling substrate 2. The substrate 2 is soldered to the package 14 with the electrodes 1 aligned with the tops of the thermoelectric elements 4. When a voltage is applied between the terminals of the package 14 connected to the wirings 13, a current flows through the thermoelectric elements 4 via the electrodes 1 and 3. As a result, the substrate 2 is heated or cooled due to the Peltier effect of the elements 4.

In summary, it will be seen that the present invention provides a temperature controlled optical coupling structure having various unprecedented advantages, as follows. An optical coupling substrate is included in an optical coupling system and reduces the number of optical parts. This configuration is far lower in cost than the conventional configuration including a lens system implemented by expensive optical parts. Metal electrodes for wiring are formed on the rear of the optical coupling substrate and directly soldered to thermoelectric elements, omitting an upper electrode substrate essential with a conventional Peltier cooler; only the optical coupling substrate is selectively heated or cooled. As a result, the thermal capacity of the object to heat and cool is reduced and, in turn, reduces the power consumption of a Peltier element necessary for the temperature control of the optical coupling system.

Because the structure of the present invention omits one electrode substrate, it reduces the overall height of an optical coupling module, compared to the conventional module using a Peltier cooler.

When thermoelectric elements are directly soldered to metal electrodes formed on a package, even a lower electrode substrate can be omitted. This further reduces the overall height of the optical coupling module. Further, because a lower electrode substrate is absent between the thermoelectric elements and the package, heat output from the optical coupling substrate can be efficiently radiated via the package. Consequently, the ability to cool the thermoelectric elements is enhanced, further reducing the power consumption of the Peltier elements. In addition, the absence of the lower electrode substrate further reduces the number of parts and therefore cost.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A temperature controlled optical coupling structure, comprising:

an optical coupling substrate;

an electrode substrate;

a plurality of thermoelectric elements positioned between said optical coupling substrate and said electrode substrate;

electrodes positioned on said optical coupling substrate and said electrode substrate which are electrically connected to said thermoelectric elements and permit current flow therethrough to allow selective heating and cooling of said optical coupling substrate by a Peltier effect;

at least one optical element mounted on a surface of said optical coupling substrate;

at least one optical fiber mounted on said surface of said optical coupling substrate, said optical element and said optical fiber being axially aligned; and a thermistor mounted on said surface of said optical coupling substrate.

2. The temperature controlled optical coupling structure of claim 1 wherein said optical element is a light emitting element.

3. The temperature controlled optical coupling structure of claim 1 further comprising at least a second optical fiber mounted on said surface of said substrate, said second optical fiber being axially aligned with said optical element.

4. The temperature controlled optical coupling structure of claim 1 wherein said electrode substrate includes electrical conducting pathways formed therein and terminals, said electrical conducting pathways connecting said terminals to said electrodes on said electrode substrate.

5. A temperature controlled optical coupling structure, comprising:

an optical coupling substrate;

an electrode substrate;

a plurality of thermoelectric elements positioned between said optical coupling substrate and said electrode substrate;

electrodes positioned on said optical coupling substrate and said electrode substrate which are electrically connected to said thermoelectric elements and permit current flow therethrough to allow selective heating and cooling of said optical coupling substrate by a Peltier effect;

a plurality of optical elements mounted on a surface of said optical coupling substrate;

a plurality of optical fibers mounted on said surface of said optical coupling substrate, each of said plurality of optical elements being axially aligned with one of said plurality of optical fibers; and a thermistor mounted on said surface of said optical coupling substrate.

* * * * *